United States Patent
Murakami et al.

(10) Patent No.: US 9,620,608 B2
(45) Date of Patent: Apr. 11, 2017

(54) SEMICONDUCTOR DEVICE AND MANUFACTURING METHOD THEREOF

(71) Applicant: TOYODA GOSEI CO., LTD., Kiyosu-shi (JP)

(72) Inventors: Noriaki Murakami, Kiyosu (JP); Toru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/280,398

(22) Filed: May 16, 2014

(65) Prior Publication Data

US 2014/0353832 A1    Dec. 4, 2014

(30) Foreign Application Priority Data

May 29, 2013 (JP) ................. 2013-112500
Oct. 29, 2013 (JP) ................. 2013-224210

(51) Int. Cl.
*H01L 33/00* (2010.01)
*H01L 29/45* (2006.01)
(Continued)

(52) U.S. Cl.
CPC .......... *H01L 29/452* (2013.01); *H01L 21/244* (2013.01); *H01L 21/28575* (2013.01); *H01L 33/36* (2013.01); *H01L 33/382* (2013.01); *H01L 33/385* (2013.01); *H01L 21/441* (2013.01); *H01L 28/60* (2013.01); *H01L 29/10* (2013.01); *H01L 2224/05166* (2013.01); *H01L 2933/0016* (2013.01)

(58) Field of Classification Search
CPC . H01L 21/28575; H01L 21/244; H01L 21/44; H01L 28/60; H01L 28/75; H01L 29/10; H01L 29/452; H01L 33/36; H01L 33/382; H01L 33/385; H01L 2933/0016; H01L 2224/05166
See application file for complete search history.

(56) References Cited

U.S. PATENT DOCUMENTS 6,323,044 B1 * 11/2001 Harris ............... H01L 28/60
                                                    257/E21.011
8,735,904 B2    5/2014 Chang et al.
(Continued)

FOREIGN PATENT DOCUMENTS

JP    H 04-109674 A    4/1992
JP    2783349 B2    8/1998
(Continued)

*Primary Examiner* — Su C Kim
(74) *Attorney, Agent, or Firm* — McGinn IP Law Group, PLLC

(57) ABSTRACT

An object is to use an electrode made of a less expensive material than gold (Au). A semiconductor device comprises: a first titanium layer that is formed to cover at least part of a semiconductor layer and is made of titanium; an aluminum layer that is formed on the first titanium layer on opposite side of the semiconductor layer and mainly consists of aluminum; a titanium nitride layer that is formed on the aluminum layer on opposite side of the first titanium layer and is made of titanium nitride; and an electrode layer that is formed on the titanium nitride layer on opposite side of the aluminum layer and is made of copper.

9 Claims, 9 Drawing Sheets

(51) Int. Cl.
*H01L 33/38* (2010.01)
*H01L 21/24* (2006.01)
*H01L 33/36* (2010.01)
*H01L 21/285* (2006.01)
*H01L 29/10* (2006.01)
*H01L 21/441* (2006.01)
*H01L 49/02* (2006.01)

(56) References Cited

U.S. PATENT DOCUMENTS

| | | | |
|---|---|---|---|
| 2001/0022367 A1 | 9/2001 | Nakamura et al. | |
| 2002/0011614 A1* | 1/2002 | Rhodes | H01L 27/14609 257/291 |
| 2004/0159836 A1 | 8/2004 | Sugimoto et al. | |
| 2011/0042708 A1* | 2/2011 | Nihei | H01L 33/0079 257/99 |
| 2011/0133175 A1* | 6/2011 | Ryu et al. | 257/43 |
| 2012/0033698 A1* | 2/2012 | Morizumi | 372/45.011 |
| 2013/0105863 A1* | 5/2013 | Lee | H01L 29/42364 257/194 |

FOREIGN PATENT DOCUMENTS

| | | |
|---|---|---|
| JP | 2003-224298 A | 8/2003 |
| JP | 2004-274042 A | 9/2004 |
| JP | 2008-171890 A | 7/2008 |
| JP | 2010-001505 A | 1/2010 |

\* cited by examiner

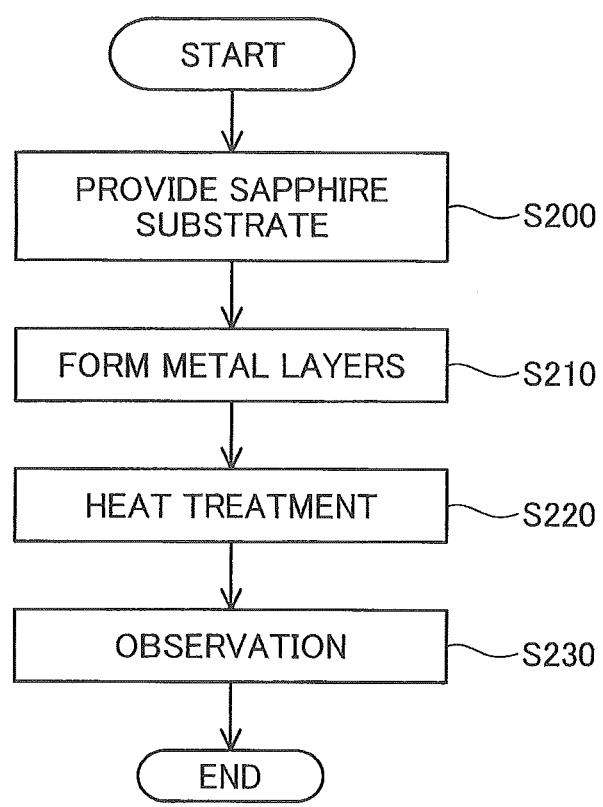

Fig.6A
Fig.6B
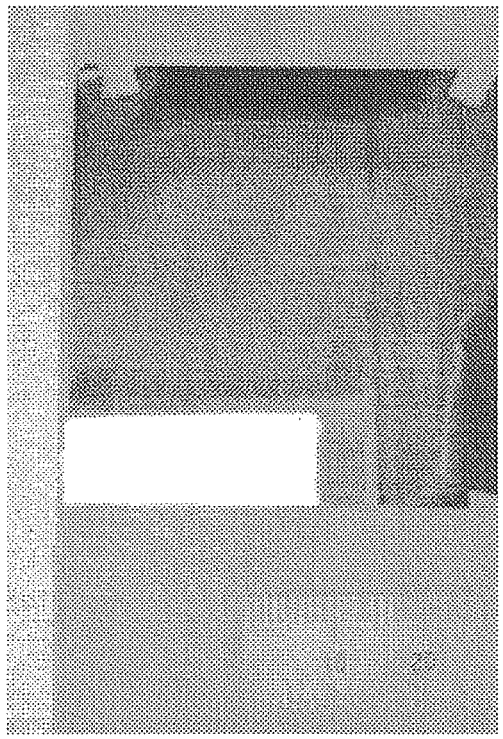
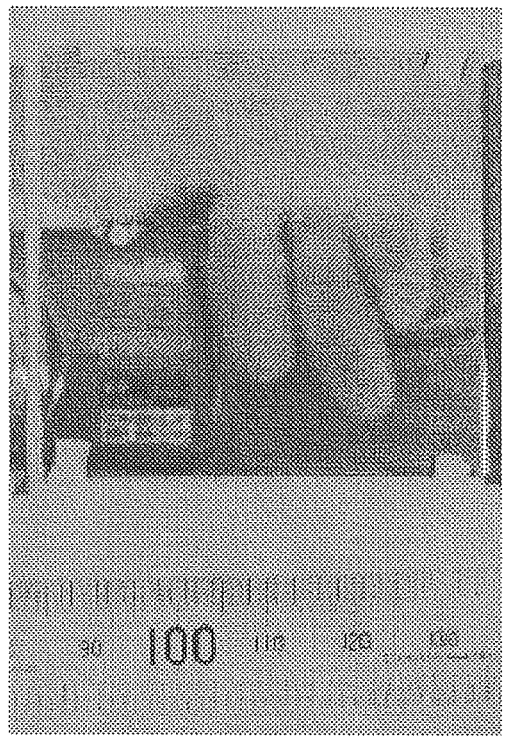

Fig.7

| OUTERMOST SURFACE ELECTRODE | TEST EXAMPLE | BARRIER METAL | HEAT TREATMENT | | | | | |
|---|---|---|---|---|---|---|---|---|
| | | | 400°C 30min | 400°C 30min +400°C 30min | 400°C 30min +450°C 30min | 400°C 30min +500°C 30sec | 400°C 30min +500°C 5min | 550°C 5min |
| Cu=100nm | 1 | TiN=25nm | × | | | | | |
| | 2 | TiN=100nm | × | | | | | |
| | 3 | TiN=200nm | ○ | ○ | ○ | ○ | ○ | × |
| | 4 | Ti/TiN/Ti=5/75/5nm | × | | | | | |
| | 5 | Ti/TiN/Ti=5/100/5nm | ○ | ○ | ○ | ○ | ○ | × |

SEMICONDUCTOR DEVICE AND MANUFACTURING METHOD THEREOF

CROSS-REFERENCE TO RELATED APPLICATION

The present application claims priority from Japanese patent applications No. 2013-112500 filed on May 29, 2013, and No. 2013-224210 filed on Oct. 29, 2013, the entirety of disclosures of which is hereby incorporated by reference into this application.

TECHNICAL FIELD

The invention relates to a semiconductor device.

BACKGROUND ART

Gold (Au) is conventionally used for an electrode of a semiconductor made of gallium nitride (for example, JP 2006-173386A). In this proposed semiconductor device, an aluminum (Al) layer and a barrier metal layer are sequentially formed on a semiconductor substrate, and an electrode layer made of gold (Au) is formed on the barrier metal layer.

DISCLOSURE OF THE INVENTION

The prior art described above, however, uses gold for the electrode and accordingly increases the manufacturing cost. There are also other needs to the prior art semiconductor device: downsizing, resource saving, easy manufacturing, accurate manufacturing and improved workability.

In order to solve at least part of the problems described above, the invention may be implemented by the following aspects.

(1) According to one aspect of the invention, there is provided a semiconductor device. The semiconductor device has: a first titanium layer that is formed to cover at least part of a semiconductor layer and is made of titanium; an aluminum layer that is formed on the first titanium layer on opposite side of the semiconductor layer and mainly consists of aluminum; a titanium nitride layer that is formed on the aluminum layer on opposite side of the first titanium layer and is made of titanium nitride; and an electrode layer that is formed on the titanium nitride layer on opposite side of the aluminum layer and is made of copper. The titanium nitride layer has a thickness equal to or greater than 200 nm. The semiconductor device of this aspect enables a less expensive material than gold (Au) to be used for the electrode.

(2) According to another aspect of the invention, there is provided a semiconductor device. The semiconductor device has: a first titanium layer that is formed to cover at least part of a semiconductor layer and is made of titanium; an aluminum layer that is formed on the first titanium layer on opposite side of the semiconductor layer and mainly consists of aluminum; a titanium nitride layer that is formed on the aluminum layer on opposite side of the first titanium layer and is made of titanium nitride; an electrode layer that is formed on the titanium nitride layer on opposite side of the aluminum layer and is made of copper; and a second titanium layer that is formed either between the aluminum layer and the titanium nitride layer or between the titanium nitride layer and the electrode layer and is made of titanium. The titanium nitride layer has a thickness of greater than 75 nm. The semiconductor device of this aspect enables a less expensive material than gold (Au) to be used for the electrode. The semiconductor device of this aspect also allows for reduction in thickness of the titanium nitride layer, compared with a semiconductor device without the second titanium layer.

(3) According to one embodiment of the semiconductor device of the above aspect, the second titanium layer may have a thickness equal to or greater than 5 nm.

(4) According to another aspect of the invention, there is provided a semiconductor device. The semiconductor device has: a first titanium layer that is formed to cover at least part of a semiconductor layer and is made of titanium; an aluminum layer that is formed on the first titanium layer on opposite side of the semiconductor layer and mainly consists of aluminum; a titanium nitride layer that is formed on the aluminum layer on opposite side of the first titanium layer and is made of titanium nitride; an electrode layer that is formed on the titanium nitride layer on opposite side of the aluminum layer and is made of copper; a second titanium layer that is formed between the aluminum layer and the titanium nitride layer and is made of titanium; and a third titanium layer that is formed between the titanium nitride layer and the electrode layer and is made of titanium. The titanium nitride layer has a thickness of greater than 75 nm. The semiconductor device of this aspect enables a less expensive material than gold (Au) to be used for the electrode. The semiconductor device of this aspect also allows for reduction in thickness of the titanium nitride layer, compared with a semiconductor device without the second and third titanium layers.

(5) According to one embodiment of the semiconductor device of the above aspect, the second titanium layer and the third titanium layer may respectively have thicknesses equal to or greater than 5 nm.

(6) According to one embodiment of the semiconductor device of any of the above aspects, the semiconductor layer may be made of an n-type semiconductor of a group III nitride. The semiconductor device of this embodiment ensures good ohmic contact between the n-type semiconductor of the group III nitride and the electrode.

(7) According to another embodiment of the semiconductor device of any of the above aspects, after a first surface of the semiconductor layer is subject to a process treatment, the first titanium layer may be formed on a surface of the semiconductor layer opposite to the first surface. In the semiconductor device of this embodiment, the electrode layer may be formed over the entire surface of the semiconductor layer opposite to the surface subject to the process treatment. This reduces the resistance between electrodes when the semiconductor device is mounted on another device. This also improves the adhesiveness when the semiconductor device is mounted on another device.

(8) According to another aspect of the invention, there is provided a manufacturing method of a semiconductor device. The manufacturing method of the semiconductor device comprises the steps of forming a first titanium layer that is made of titanium and covers at least part of a semiconductor layer; forming an aluminum layer that mainly consists of aluminum on the first titanium layer on opposite side of the semiconductor layer; forming a titanium nitride layer that is made of titanium nitride on the aluminum layer on opposite side of the first titanium layer; and forming an electrode layer that is made of copper on the titanium nitride layer on opposite side of the aluminum layer. The step of forming the titanium nitride layer forms the titanium nitride layer to have a thickness equal to or greater than 200 nm. The manufacturing method of the semiconductor device of this aspect uses a less expensive material than gold (Au) for the electrode and thereby reduces the manufacturing cost of the semiconductor device.

(9) According to another aspect of the invention, there is provided a manufacturing method of a semiconductor device. The manufacturing method of the semiconductor device comprises the steps of forming a first titanium layer that is made of titanium and covers at least part of a semiconductor layer; forming an aluminum layer that mainly consists of aluminum on the first titanium layer on opposite side of the semiconductor layer; forming a titanium nitride layer that is made of titanium nitride on the aluminum layer on opposite side of the first titanium layer; forming an electrode layer that is made of copper on the titanium nitride layer on opposite side of the aluminum layer; and forming a second titanium layer that is made of titanium either between the forming the aluminum layer and the forming the titanium nitride layer or between the forming the titanium nitride layer and the forming the electrode layer. The step of forming the titanium nitride layer forms the titanium nitride layer to have a thickness of greater than 75 nm. The manufacturing method of the semiconductor device of this aspect uses a less expensive material than gold (Au) for the electrode and thereby reduces the manufacturing cost of the semiconductor device. The manufacturing method of the semiconductor device of this aspect also allows for reduction in thickness of the titanium nitride layer, compared with a manufacturing method of a semiconductor device without the second titanium layer.

(10) According to another aspect of the invention, there is provided a manufacturing method of a semiconductor device. The manufacturing method of the semiconductor device comprises the steps of forming a first titanium layer that is made of titanium and covers at least part of a semiconductor layer; forming an aluminum layer that mainly consists of aluminum on the first titanium layer on opposite side of the semiconductor layer; forming a titanium nitride layer that is made of titanium nitride on the aluminum layer on opposite side of the first titanium layer; forming an electrode layer that is made of copper on the titanium nitride layer on opposite side of the aluminum layer; forming a second titanium layer that is made of titanium between the forming the aluminum layer and the forming the titanium nitride layer; and forming a third titanium layer that is made of titanium between the forming the titanium nitride layer and the forming the electrode layer. The step of forming the titanium nitride layer forms the titanium nitride layer to have a thickness of greater than 75 nm. The manufacturing method of the semiconductor device of this aspect uses a less expensive material than gold (Au) for the electrode and thereby reduces the manufacturing cost of the semiconductor device. The manufacturing method of the semiconductor device of this aspect also allows for reduction in thickness of the titanium nitride layer, compared with a manufacturing method of a semiconductor device without the second and third titanium layers.

(11) According to one embodiment, the manufacturing method of the semiconductor device of any of the above aspects may further comprise the step of; after the step of forming the electrode layer, performing heat treatment for a layered structure of the respective formed layers at temperature of lower than 550° C. The semiconductor layer may be made of an n-type semiconductor of a group III nitride. The manufacturing method of the semiconductor device of this embodiment ensures good ohmic contact between the n-type semiconductor of the group III nitride and the electrode.

(12) According to another embodiment of the manufacturing method of the semiconductor device of any of the above aspect, the step of forming the first titanium layer to the step of forming the electrode layer may be all performed in a non-oxygen atmosphere. The manufacturing method of the semiconductor device of this embodiment prevents oxidation of the respective metal layers.

(13) According to another embodiment of the manufacturing method of the semiconductor device of any of the above aspect, the step of forming the first titanium layer to the step of forming the electrode layer may be performed continuously. The manufacturing method of the semiconductor device of this embodiment enables the respective forming steps to be performed continuously in the same apparatus, thus reducing the work load.

The plurality of components included in each aspect of the invention described above are not all essential, but some components among the plurality of components may be appropriately changed, omitted or replaced with other components or part of the limitations may be deleted, in order to solve part or all of the problems described above or in order to achieve part or all of the advantageous effects described herein. In order to solve part or all of the problems described above or in order to achieve part or all of the advantageous effects described herein, part or all of the technical features included in one aspect of the invention described above may be combined with part or all of the technical features included in another aspect of the invention described above to provide still another independent aspect of the invention.

The invention may be implemented by any of various aspects other than the semiconductor device, for example, a power converter including the semiconductor device.

BRIEF DESCRIPTION OF DRAWINGS

FIG. 5 is a flowchart showing a procedure of producing a test product used for performance evaluation of the semiconductor device according to the embodiment;

FIGS. 6A and 6B are images of test products viewed from the electrode side after heat treatment;

FIG. 7 is a table showing the results of performance evaluation;

BEST MODE FOR CARRYING OUT THE INVENTION

A. First Embodiment

A1. Structure of Semiconductor Device 100

Figure 1:
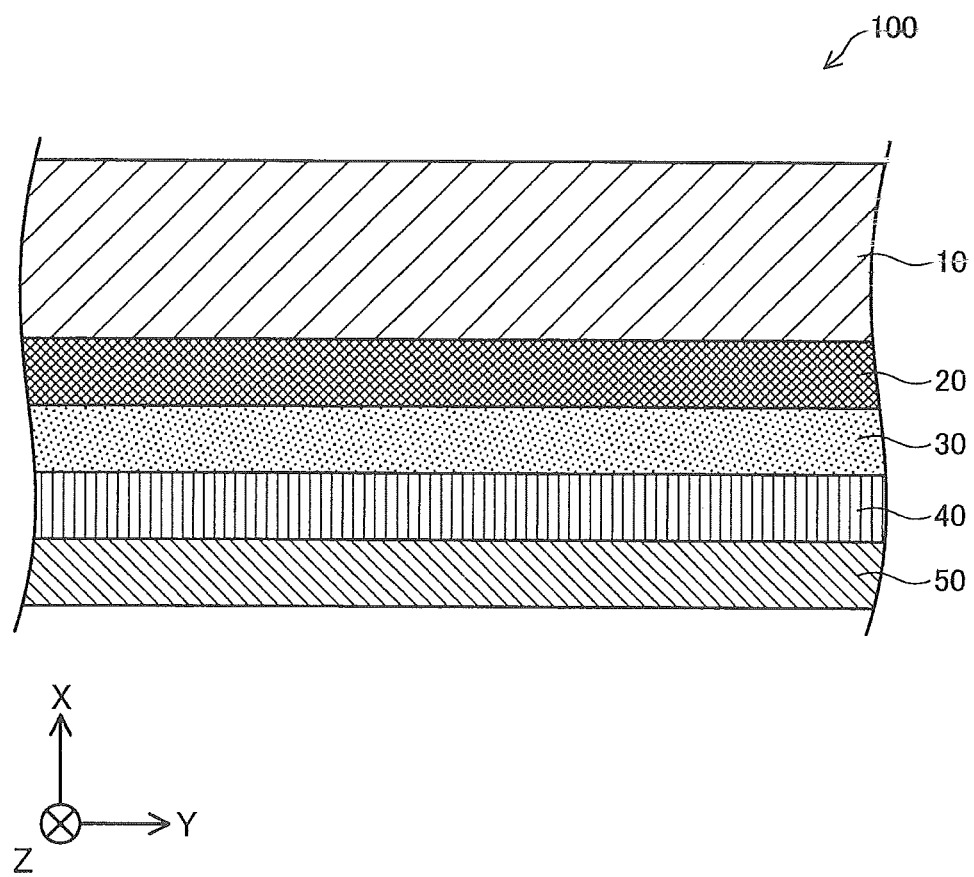
FIG. 1 is a cross sectional view schematically illustrating the structure of a semiconductor device 100 according to a first embodiment.

FIG. 1 is a cross sectional view schematically illustrating the structure of a semiconductor device 100 according to a first embodiment. FIG. 1 illustrates part of the cross section of the semiconductor device 100 according to the embodiment. The illustration of FIG. 1 is provided for the purpose of clearly showing the technical features of the semiconductor device 100 and does not accurately represent the thicknesses of the respective layers. In order to facilitate the explanation, XYZ axes orthogonal to one another are illustrated in FIG. 1. The same applies to subsequent drawings. In the description hereof, the thickness of a layer denotes the thickness in the X-axis direction.

The semiconductor device 100 of this embodiment is an SBD (Schottky Barrier Diode). The semiconductor device 100 includes a semiconductor layer 10, a titanium layer 20, an aluminum layer 30, a titanium nitride layer 40 and an electrode layer 50.

The semiconductor layer 10 is made of an n-type semiconductor of a group III nitride. The "group III nitride" is a group III-V compound using nitrogen as the group-V element. Examples of the group III nitride include aluminum nitride, gallium nitride and indium nitride. The "n-type semiconductor" is a semiconductor with addition of, for example, silicon (Si) or germanium (Ge) as the donor impurity in the case of the group III nitride. According to this embodiment, gallium nitride is used as the semiconductor. The semiconductor layer 10 in the description hereof is also called semiconductor substrate 10.

Compared with other semiconductors, gallium nitride has the following advantages: (i) good thermal conductivity and thereby excellent heat radiation; (ii) operability even at high temperatures; (iii) high electron saturation rate; and (iv) high dielectric breakdown voltage.

The titanium layer 20 is formed to cover one surface of the semiconductor layer 10. The titanium layer 20 is a layer mainly consisting of titanium. According to this embodiment, the thickness of the titanium layer 20 is 17.5 nm.

The aluminum layer 30 is formed on the titanium layer 20 on the opposite side of the semiconductor layer 10 (—X-axis direction side). The aluminum layer 30 is a layer mainly consisting of aluminum. According to this embodiment, the aluminum layer 30 is a monolayer consisting of only aluminum, and its thickness is 200 nm. The aluminum layer may, however, be made of a compound (alloy) containing 90% or more of aluminum. Such a compound has the equivalent effects to those of the aluminum monolayer. Examples of the compound (alloy) include Al—Si and Al—Cu.

The titanium nitride layer 40 is formed on the aluminum layer 30 on the opposite side of the titanium layer 20 (−X-axis direction side). The titanium nitride layer 40 is a layer mainly consisting of titanium nitride. According to this embodiment, the thickness of the titanium nitride layer 40 is 200 nm. The thickness of the titanium nitride layer 40 is preferably not greater than 2000 nm. The thickness of greater than 2000 nm is likely to cause a damage in the titanium nitride layer 40 and reduce the adhesiveness to the electrode layer 50.

The electrode layer 50 is formed on the titanium nitride layer 40 on the opposite side of the aluminum layer 30 (−X-axis direction side). The electrode layer 50 is a layer mainly consisting of copper (Cu). According to this embodiment, the thickness of the electrode layer 50 is 100 nm.

This structure uses copper, which is less expensive than gold, for the electrode and thereby reduces the manufacturing cost. This structure also ensures the good ohmic contact between the semiconductor and the electrode (copper).

A2. Manufacturing Procedure of Semiconductor Device 100

Figure 2:
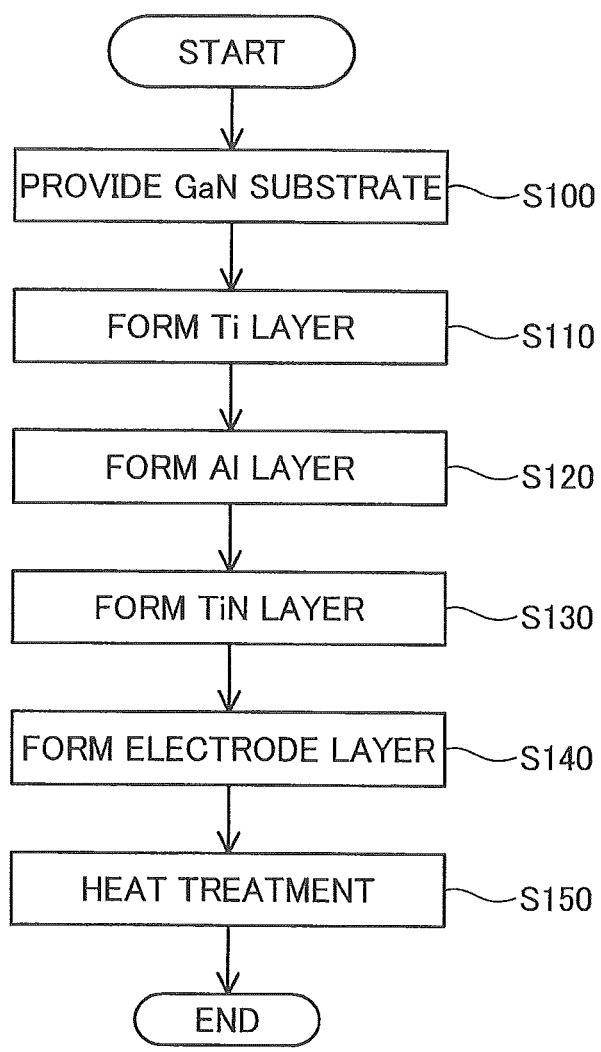
FIG. 2 is a flowchart showing a manufacturing procedure of the semiconductor device 100 according to the first embodiment.

FIG. 2 is a flowchart showing a manufacturing procedure of the semiconductor device 100 according to the first embodiment. At step S100, the procedure provides the semiconductor substrate 10. One surface of the semiconductor substrate 10 which the titanium layer 20 is formed on has been subject to etching in advance. Etching generally includes dry etching and wet etching, but dry etching is used according to this embodiment. Etching reduces the contact resistivity. The other surface (+X-axis direction side) of the semiconductor substrate 10 opposite to the surface which the titanium layer 20 is formed on has been subject to a process treatment in advance.

The process treatment performed in advance includes: (i) formation of a concave-convex shape on the semiconductor layer 10; (ii) formation of a source electrode; (iii) formation of an insulating layer; (iv) dry etching; (v) formation of a drain electrode; (vi) formation of a gate electrode; and (vii) heat treatment.

At subsequent step S110, the procedure forms the titanium layer 20 on one surface (−X-axis direction side) of the semiconductor substrate 10, which has not been subject to the process treatment. The titanium layer 20 is formed by sputtering. More specifically, the procedure introduces argon into a chamber in a non-oxygen atmosphere and subsequently places the semiconductor layer 10 in the chamber. The procedure then exposes a target to the nucleus of argon (Ar) plasma. The atoms in the target exposed to the nucleus of argon plasma are released and adhere on one surface (−X-axis direction side) of the semiconductor substrate 10 opposite to the other surface which has been subject to the process treatment in advance. The sputtering technique ensures formation of a uniform film in a short time over the entire surface (−X-axis direction side) of the semiconductor substrate 10 opposite to the other surface which has been subject to the process treatment in advance. The conditions of sputtering including RF (radio frequency) power depend on equipment used for sputtering and are adequately set to optimum conditions. The same applies to sputtering of the other layers.

The target used at step S110 is a target that releases titanium. The "non-oxygen atmosphere" denotes an atmosphere having the oxygen partial pressure of less than 1% of the oxygen partial pressure in the air.

At step S120, the procedure forms the aluminum layer 30 on the surface (surface on the −X-axis direction side) of the titanium layer 20. The aluminum layer 30 is also formed by sputtering. A target used at step S120 is a target that releases aluminum.

At step S130, the procedure forms the titanium nitride layer 40 on the surface (surface on the −X-axis direction side) of the aluminum layer 30. The titanium nitride layer 40 is also formed by sputtering. A target used at step S130 is a target that releases titanium. In the course of sputtering at step S130, nitrogen gas is introduced along with argon into the chamber. Sputtering under this condition forms the titanium nitride layer 40 on the surface (surface on the −X-axis direction side) of the aluminum layer 30.

At step S140, the procedure forms the electrode layer 50 on the surface (surface on the −X-axis direction side) of the titanium nitride layer 40. The electrode layer 50 is also formed by sputtering. A target used at step S140 is a target that releases copper. According to this embodiment, formation of the respective films at steps S110 to S140 is continuously performed with the semiconductor substrate 10 kept in the chamber.

At step S150, the procedure performs heat treatment. The heat treatment according to this embodiment denotes heat treatment to make ohmic contact between the semiconductor layer 10 and the electrode layer 50. According to this embodiment, the heat treatment is performed at 400° C. for 30 minutes. The semiconductor device 100 of this embodiment is manufactured by this manufacturing procedure.

The manufacturing method of the semiconductor device according to this embodiment uses copper, which is less expensive than gold, for the electrode and thereby reduces the manufacturing cost of the semiconductor device. The manufacturing method of the semiconductor device according to this embodiment also ensures the good ohmic contact between the semiconductor made of gallium nitride and the electrode.

The step of forming the titanium layer 20 (step S110) to the step of forming the electrode layer 50 (step S140) are all performed in the non-oxygen atmosphere. This prevents oxidation of the respective metal layers.

According to this embodiment, the respective layers (20, 30, 40 and 50) are formed on the entire surface (−X-axis direction side) of the semiconductor substrate 10 opposite to the surface which has been subject to the process treatment in advance. The electrode layer 50 is formed over the entire surface (surface on the −X-axis direction side). This reduces the resistance between the electrodes when the semiconductor device 100 is mounted on another device. This also improves the adhesiveness when the semiconductor device 100 is mounted on another device.

B. Second Embodiment

B1. Structure of Semiconductor Device 110

Figure 3:
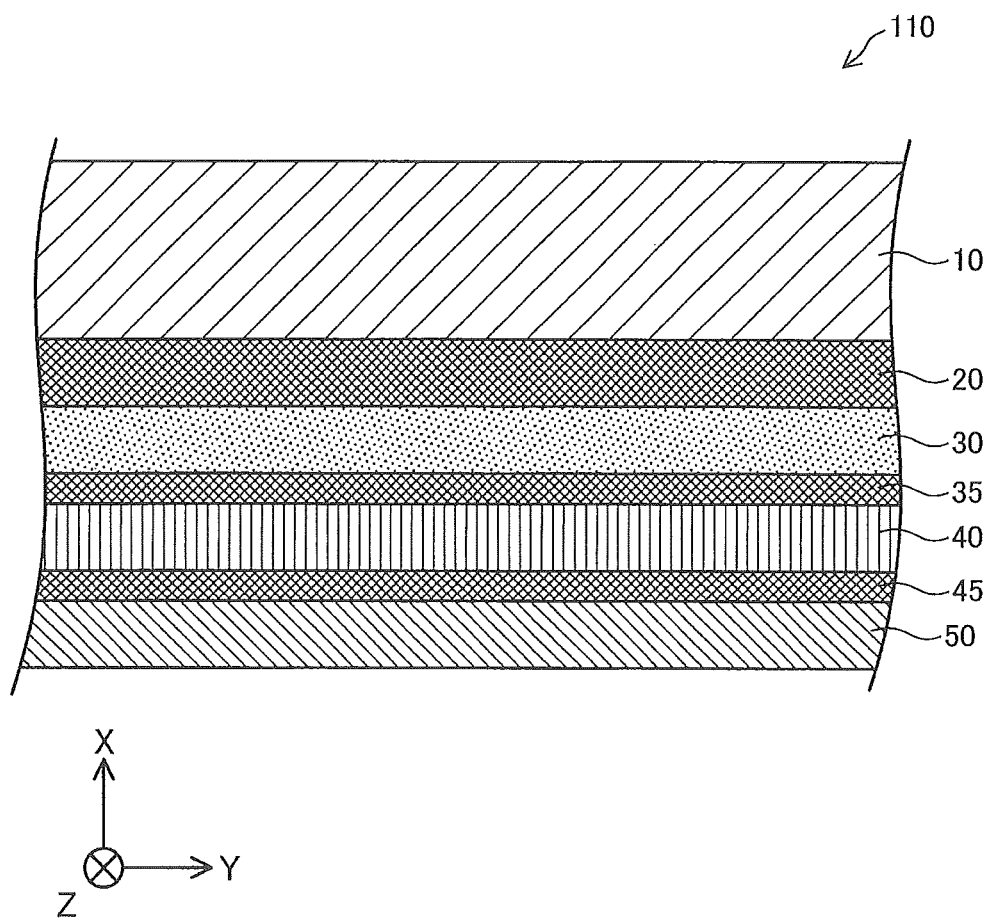
FIG. 3 is a cross sectional view schematically illustrating the structure of a semiconductor device 110 according to a second embodiment.

FIG. 3 is a cross sectional view schematically illustrating the structure of a semiconductor device 110 according to a second embodiment. FIG. 3 illustrates part of the cross section of the semiconductor device 110 according to the embodiment. Like FIG. 1, the illustration of FIG. 3 is provided for the purpose of clearly showing the technical features of the semiconductor device 110 and does not accurately represent the thicknesses of the respective layers.

The semiconductor device 110 of the second embodiment differs from the semiconductor device 100 of the first embodiment shown in FIG. 1 by: (i) formation of additional titanium layers 35 and 45; and the thickness of the titanium nitride layer 40. Otherwise the semiconductor device 110 of the second embodiment has the same structure as that of the semiconductor device 100 of the first embodiment.

The titanium layer 35 is formed between the aluminum layer 30 and the titanium nitride layer 40. The titanium layer 35 is a layer mainly consisting of titanium. According to this embodiment, the thickness of the titanium layer 35 is 5 nm.

The titanium layer 45 is formed between the titanium nitride layer 40 and the electrode layer 50. The titanium layer 45 is a layer mainly consisting of titanium. According to this embodiment, the thickness of the titanium layer 45 is 5 nm.

In the semiconductor device 100 of the first embodiment, the thickness of the titanium nitride layer 40 is 200 nm. In the semiconductor device 110 of the second embodiment, on the other hand, the thickness of the titanium nitride layer 40 is 100 nm.

As described above, in the semiconductor device 110, the titanium layer 35 and the titanium layer 45 are formed across the titanium nitride layer 40 in the thickness direction of the layers (X-axis direction). Accordingly, the titanium nitride layer 40 of the second embodiment is made thinner, compared with that in the semiconductor device 100 of the first embodiment. Like the semiconductor device 100, the semiconductor device 110 is manufactured with the low manufacturing cost and ensures good ohmic contact between the semiconductor and the electrode.

B2. Manufacturing Procedure of Semiconductor Device 110

Figure 4:
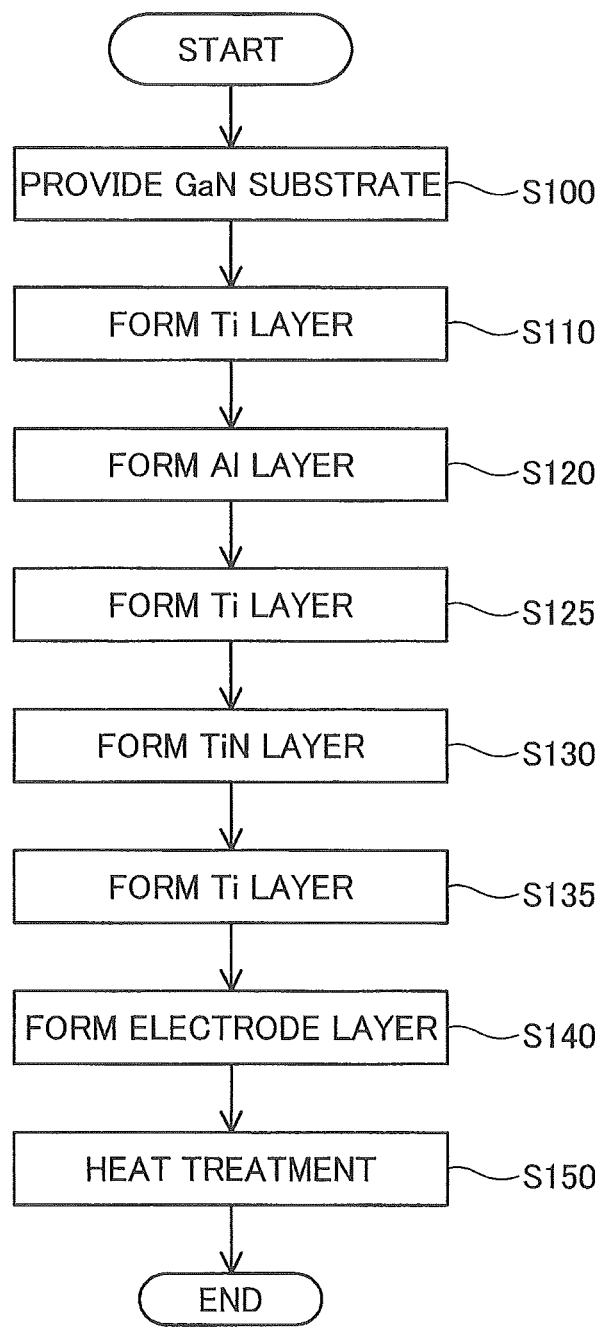
FIG. 4 is a flowchart showing a manufacturing procedure of the semiconductor device 110 according to the second embodiment.

FIG. 4 is a flowchart showing a manufacturing procedure of the semiconductor device 110 according to the second embodiment. The manufacturing procedure of the semiconductor device 110 according to the second embodiment differs from the manufacturing procedure of the semiconductor device 100 shown in FIG. 2 by: (i) additional steps of forming the additional titanium layers (steps S125 and S135); and (ii) the thickness of the titanium nitride layer 40 at step S130. The other steps in the manufacturing procedure of the semiconductor device 110 are identical with those in the manufacturing procedure of the semiconductor device 100.

The manufacturing procedure of the semiconductor device 110 performs step S125 between step S120 and step S130. At step S125, the procedure forms the titanium layer 35 on the surface (surface on the −X-axis direction side) of the aluminum layer 30. The titanium layer 35 is also formed by sputtering.

The manufacturing procedure of the semiconductor device 110 performs step S135 between step S130 and step S140. At step S135, the procedure forms the titanium layer 45 on the surface (surface on the −X-axis direction side) of the titanium nitride layer 40. The titanium layer 45 is also formed by sputtering.

In the manufacturing procedure of the semiconductor device 100 according to the first embodiment, the thickness of the titanium nitride layer 40 formed at step S130 is 200 nm. In the manufacturing procedure of the semiconductor device 110 according to the second embodiment, on the other hand, the thickness of the titanium nitride layer 40 at step S130 is 100 nm.

C. Performance Evaluation

C1. Evaluation of Reaction Between Metals

A reaction between metals in the respective layers, for example, a reaction between aluminum in the aluminum layer 30 and copper in the electrode layer 50, does not give the good ohmic contact between the semiconductor layer 10 and the electrode layer 50. Performance evaluation was accordingly performed to determine whether there was a reaction between the metals in the respective layers in the semiconductor device 100 of the embodiment.

FIG. 5 is a flowchart showing a procedure of producing a test product used for performance evaluation of the semiconductor device according to the embodiment. At step S200, the procedure provides a sapphire substrate. According to this embodiment, gallium nitride is used as the semiconductor. For performance evaluation, however, a sapphire substrate is used because of the following reasons: (i) the sapphire substrate is less expensive; and (ii) the sapphire substrate is transparent, so that the occurrence of a reaction between the respective metal layers is visible from the sapphire substrate side.

At step S210, the procedure forms metal layers on the sapphire substrate. The following shows the structures of the respective metal layers in test examples used for an experiment:

TEST EXAMPLE 1

(sapphire substrate/) titanium layer 20 (thickness: 17.5 nm)/aluminum layer 30 (thickness: 200 nm)/titanium nitride layer 40 (thickness: 25 nm)/electrode layer 50 (thickness: 100 nm)

TEST EXAMPLE 2

(sapphire substrate/) titanium layer 20 (thickness: 17.5 nm)/aluminum layer 30 (thickness: 200 nm)/titanium nitride layer 40 (thickness: 100 nm)/electrode layer 50 (thickness: 100 nm)

TEST EXAMPLE 3

(sapphire substrate/) titanium layer 20 (thickness: 17.5 nm)/aluminum layer 30 (thickness: 200 nm)/titanium nitride layer 40 (thickness: 200 nm)/electrode layer 50 (thickness: 100 nm)

Test Examples 1 to 3 differ from one another only by the thickness of the titanium nitride layer 40 but are otherwise the same.

TEST EXAMPLE 4

(sapphire substrate/) titanium layer 20 (thickness: 17.5 nm)/aluminum layer 30 (thickness: 200 nm)/titanium layer 35 (thickness: 5 nm)/titanium nitride layer 40 (thickness: 75 nm)/titanium layer 45 (thickness: 5 nm)/electrode layer 50 (thickness: 100 nm)

TEST EXAMPLE 5

(sapphire substrate/) titanium layer 20 (thickness: 17.5 nm)/aluminum layer 30 (thickness: 200 nm)/titanium layer 35 (thickness: 5 nm)/titanium nitride layer 40 (thickness: 100 nm)/titanium layer 45 (thickness: 5 nm)/electrode layer 50 (thickness: 100 nm)

Test Examples 4 and 5 differ from each other only by the thickness of the titanium nitride layer 40 but are otherwise the same. Test Examples 5 and 6 differ from Test Examples 1 to 3 by addition of the titanium layers 35 and 45 and the thickness of the titanium nitride layer 40, but otherwise Test Examples 4 and 5 are the same as Test Examples 1 to 3.

At step S220, the procedure performs heat treatment. Heat treatment was performed at 400° C. for 30 minutes with respect to all the test examples. For evaluation of the heat resistance, after heat treatment at 400° C. for 30 minutes and subsequent cooling down to room temperature (23° C.), Test Example 3 and Test Example 4 were subject to heat treatment: (i) at 400° C. for 30 minutes; (ii) at 450° C. for 30 minutes; (iii) at 500° C. for 30 seconds; or (iv) at 500° C. for 5 minutes. Test Examples 3 and 4 were also subject to (v) heat treatment at 550° C. for 5 minutes.

At step S230, the procedure visually observes the occurrence of a reaction between metals from the sapphire substrate side and the electrode layer side.

FIGS. 6A and 6B are images of test products viewed from the electrode side after heat treatment. FIG. 6A is an image in which a reaction between metals was visually observed, and FIG. 6B is an image in which no reaction between metals was visually observed. The photographer's hand was imaged by light reflection in both the images of FIGS. 6A and 6B. It is, however, visually recognized that light is reflected correctly in FIG. 6B but a black blurred part is observed in the upper portion of the image in FIG. 6A. This part indicates the reaction between metals.

FIG. 7 is a table showing the results of performance evaluation. The symbol "circle" shows that no reaction between metals was visually recognized, and the symbol "cross mark" shows that a reaction between metals was visually recognized.

According to the results of this performance evaluation, in the arrangement of metal layers in the same formation order as that of the semiconductor device 100, no reaction between metals was visually recognized under the condition that the titanium nitride layer 40 had the thickness of not less than 200 nm (Test Examples 2 and 3). In the arrangement of metal layers in the same formation order as that of the semiconductor device 110, no reaction between metals was visually recognized under the condition that the titanium nitride layer 40 had the thickness of greater than 75 nm (Test Examples 4 and 5). With respect to the heat resistance, in the arrangement of metal layers in the same formation order as that of the semiconductor device 100, no reaction between metals was visually recognized under the condition that the titanium nitride layer 40 had the thickness of not less than 200 nm even when the test product was subjected to heat treatment at 500° C. for 5 minutes after heat treatment at 400° C. for 30 minutes (Test Example 3).

When the conditions that no reaction between metals in the respective layers was visually recognized are applied to the semiconductor device 100 or to the semiconductor device 110, it is expected to make good ohmic contact between the semiconductor layer 10 and the electrode layer 50. With respect to Test Examples 4 and 5, formation of the additional titanium layers 35 and 45 across the titanium nitride layer 40 allows for reduction of the thickness of the titanium nitride layer 40. This may be attributed to the reason that the reaction between metals is suppressed by filling the crystal grain boundary of titanium nitride with titanium. It is accordingly presumed that formation of an additional titanium layer only on one surface of the titanium nitride layer 40 may have the similar effects.

C2. Evaluation of Adhesiveness

It is generally undesirable to take a semiconductor device out of a non-oxygen condition and place the semiconductor device in an oxygen condition prior to completion of formation of the respective layers. This is attributed to the reason that an oxide film is produced on the surface of a formed layer and is likely to reduce the adhesiveness between the formed layer and a subsequently-formed layer. The adhesiveness of the metal layers was accordingly evaluated. The micro-scratch test method in conformity to JIS R-3255 was employed for evaluation of the adhesiveness.

Figure 8:
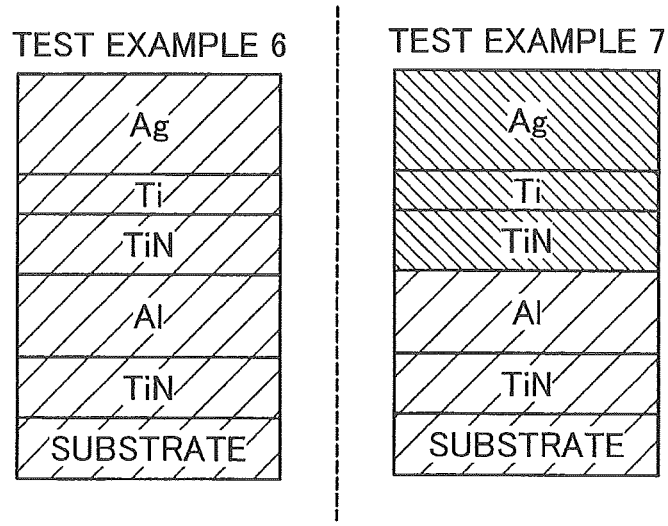
FIG. 8 is a diagram illustrating the structures of test examples.

FIG. 8 is a diagram illustrates structures of test examples. In these test example, a silicon substrate was used for the semiconductor substrate, and silver (Ag) was used for the electrode. In other words, the electrode layer used for this evaluation was a layer mainly consisting of silver. After formation of the electrode layer, both the test examples were subject to heat treatment at 400° C. for 30 minutes. In the test examples, the respective layers were formed on the silicon substrate in the following order and in the following thicknesses:

TEST EXAMPLE 6 silicon substrate/titanium nitride layer (thickness: 35 nm)/aluminum layer (thickness: 300 nm)/titanium nitride layer (thickness: 50 nm)/titanium layer (thickness: 5 nm)/electrode layer (thickness: 100 nm)

TEST EXAMPLE 7 silicon substrate/titanium nitride layer (thickness: 35 nm)/aluminum layer (thickness: 300 nm)/titanium nitride layer (thickness: 50 nm)/titanium layer (thickness: 5 nm)/electrode layer (thickness: 100 nm)

In both the test examples, the metal layers were formed in a non-oxygen atmosphere by a sputtering apparatus. In Test Example 6, the respective layers were continuously formed in the non-oxygen atmosphere. In Test Example 7, however, after formation of the aluminum layer, the semiconductor device was once exposed to an oxygen atmosphere, and the remaining layers were formed in the non-oxygen atmosphere. Otherwise the same method was employed for production of Test Example 6 and Test Example 7.

Figure 9:
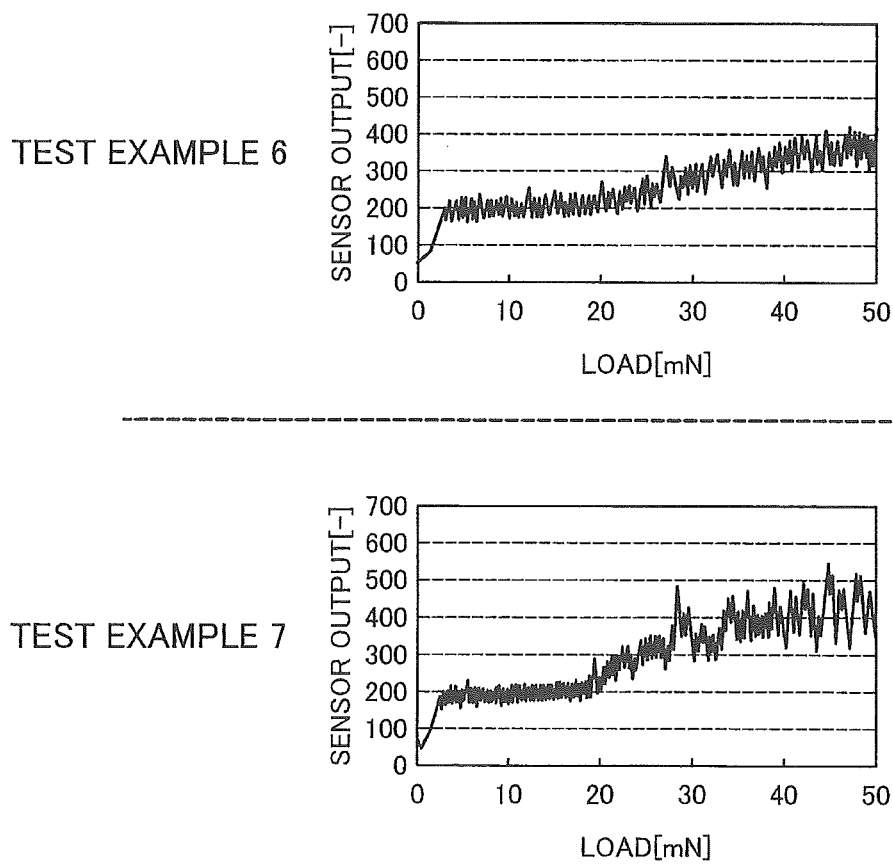
FIG. 9 is charts showing the results of micro-scratch test of the respective test examples.

FIG. 9 is charts showing results of the micro-scratch test of the respective test examples. The charts show the sensor output as the ordinate and the load (mN) as the abscissa. The larger value of the load under which a film starts peeling off indicates the higher adhesiveness. The upper chart shows the result of Test Example 6, and the lower chart shows the result of Test Example 7.

According to the results of FIG. 9, a film started peeling off under the load of about 20 mN in Test Example 7 but a film started peeling off under the load of about 25 mN in Test Example 6. These results show that the adhesiveness of the respective layers in the semiconductor device exposed to the oxygen atmosphere during formation of the respective layers is lower than the adhesiveness of the respective layers continuously formed in the non-oxygen atmosphere.

Figure 10:
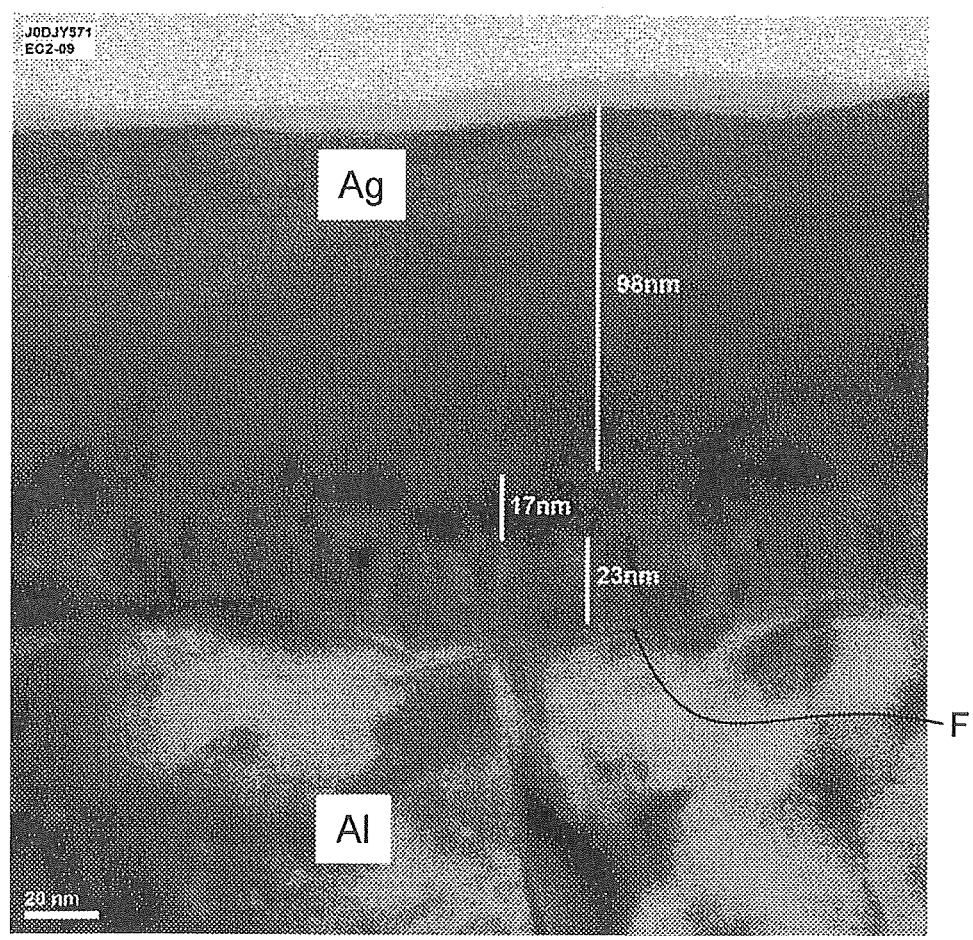
FIG. 10 is an image of the respective layers of Test Example 7 taken by TEM (transmission electron microscope).

FIG. 10 is an image of the respective layers of Test Example 7 taken by TEM (transmission electron microscope). The lowermost layer in the image is an aluminum (Al) layer, and a titanium nitride (TiN) layer, a titanium (Ti) layer and an electrode (Ag) layer are sequentially formed on the aluminum (Al) layer. This image shows that the thickness of the titanium nitride layer is about 23 nm, the thickness of the titanium layer is about 17 nm, and the thickness of the electrode layer is about 98 nm. In this image, a film F is visible between the aluminum layer and the titanium nitride layer. The film F is presumed to be an oxidized film of aluminum. While the boundaries between the respective layers except the film F are unclear, the boundary of the film F is clear. It is accordingly presumed that this film F has the low adhesiveness relative to the other layers.

The above results show that it is preferable to continuously form metal layers without exposing the semiconductor device to the oxygen atmosphere. In other words, continuous formation of respective metal layers improves the adhesiveness of the respective metal layers.

D. Modifications

The invention is not limited to the above embodiments but may be implemented by various other aspects without departing from the scope of the invention. Some of possible modifications are given below.

D1. Modification 1

According to the above embodiments, the semiconductor layer 10 is provided in advance at step S100. The invention is, however, not limited to this procedure. For example, the semiconductor layer 10 may be formed immediately before step S110. More specifically, the semiconductor layer 10 may be formed by metal organic chemical vapor deposition (MOCVD).

D2. Modification 2

According to the above embodiments, the metal layers are formed by the sputtering technique. The invention is, however, not limited to this procedure. Another technique, for example, liquid phase deposition method, vapor deposition method or chemical vapor deposition method, may be employed to form the metal layers.

D3. Modification 3

According to the above embodiments, the metal layers are formed on the semiconductor layer 10 in the following order:

First Embodiment: titanium layer 20/aluminum layer 30/titanium nitride layer 40/electrode layer 50

Second Embodiment: titanium layer 20/aluminum layer 30/titanium layer 35/titanium nitride layer 40/titanium layer 45/electrode layer 50

The respective layers are placed to be in contact with each other. The invention is, however, not limited to these structures. In the arrangement of the respective metal layers, for example, a layer consisting of titanium may be formed as a barrier metal layer on at least one boundary between the respective layers. Another component such as an impurity may be contained in each of the metal layers.

D4. Modification 4

According to the above embodiments, heat treatment was performed at 400° C. for 30 minutes. The invention is, however, not limited to this procedure. The temperature and the time of heat treatment may be any temperature and any time that ensures ohmic contact between the semiconductor and the electrode: for example, at 450° C. for 30 minutes or at 500° C. for 5 minutes.

D5. Modification 5

According to the above embodiments, the semiconductor device was SBD. The invention is, however, not limited to this semiconductor device. The semiconductor device may be, for example, FET (field effect transistor).

D6. Modification 6

According to the above embodiments, gallium nitride which is a group III nitride is used for the semiconductor. The invention is, however, not limited to this semiconductor. The semiconductor may be, for example, another group III nitride such as aluminum nitride or indium nitride, silicon, gallium arsenide or silicon carbide.

D7. Modification 7

The above embodiments use the semiconductor substrate 10 which has been subject to the process treatment in advance on the other surface opposite to the surface on which the titanium layer 20 and the other layers are formed. The invention is, however, not limited to this semiconductor substrate. For example, after formation of the electrode layer 50 on the semiconductor layer 10, the other surface of the semiconductor layer 10 on the opposite side to the electrode layer 50 may be subject to the process treatment.

D8. Modification 8

According to the above embodiments, the step of forming the titanium layer 20 (step S110) to the step of forming the electrode layer 50 (step S140) are all performed in the non-oxygen atmosphere. The invention is, however, not limited to this procedure. The step of forming the titanium layer 20 (step S110) to the step of forming the electrode layer 50 (step S140) may not necessarily be performed in the non-oxygen atmosphere, and at least one of the steps may be performed in the non-oxygen atmosphere.

D9. Modification 9

According to the above embodiments, the step of forming the titanium layer 20 (step S110) to the step of forming the electrode layer 50 (step S140) are performed continuously in the same chamber. The invention is, however, not limited to this procedure. The step of forming the titanium layer 20 (step S110) to the step of forming the electrode layer 50 (step S140) may not be formed continuously. Additionally, at least one step among the step of forming the titanium layer 20 (step S110) to the step of forming the electrode layer 50 (step S140) may be performed in a different chamber.

D10. Modification 10

According to the above embodiments, the respective layers (20, 30, 40 and 50) are formed over the entire surface of the semiconductor substrate 10 on the opposite side (−X-axis direction side) of the other surface subject to the process treatment in advance. The invention is, however, not limited to this procedure. The respective layers (20, 30, 40 and 50) may be formed not over the entire surface but on part of the surface of the semiconductor substrate 10 on the opposite side (−X-axis direction side) of the other surface subject to the process treatment in advance.

The invention is not limited to the above embodiments, examples or modifications, but a diversity of variations and modifications may be made to the embodiments without departing from the scope of the invention. For example, the technical features of the embodiments, examples or modifications corresponding to the technical features of the respective aspects described in SUMMARY OF INVENTION may be replaced or combined appropriately, in order to solve part or all of the problems described above or in order to achieve part or all of the advantageous effects described above. Any of the technical features may be omitted appropriately unless the technical feature is described as essential herein.

The invention claimed is:

1. A semiconductor device, comprising:
   a first titanium layer comprising titanium, the first titanium layer contacting with at least a part of a semiconductor layer, a surface of the first titanium layer abutting a surface of the semiconductor layer;
   an aluminum layer that is formed on the first titanium layer on an opposite side of the semiconductor layer and mainly consists of aluminum;
   a titanium nitride layer that is formed on the aluminum layer on an opposite side of the first titanium layer, the titanium nitride layer comprising titanium nitride;
   an electrode layer that is formed on the titanium nitride layer on opposite side of the aluminum layer, the electrode layer comprising copper;
   a second titanium layer that is formed between the aluminum layer and the titanium nitride layer, the second titanium layer comprising titanium; and
   a third titanium layer that is formed between the titanium nitride layer and the electrode layer, the third titanium layer comprising titanium,
   wherein the titanium nitride layer has a thickness of greater than 75 nm, and
   wherein the semiconductor layer comprises an n-type semiconductor of a Group III nitride.

2. The semiconductor device according to claim 1, wherein the second titanium layer and the third titanium layer respectively have thicknesses equal to or greater than 5 nm.

3. The semiconductor device according to claim 1, wherein, after a first surface of the semiconductor layer is subject to a process treatment, the titanium layer is formed on a second surface of the semiconductor layer opposite to the first surface.

4. A manufacturing method of a semiconductor device, the manufacturing method comprising:
   forming a first titanium layer comprising titanium, the first titanium layer contacting with at least a part of a semiconductor layer, a surface of the first titanium layer abutting a surface of the semiconductor layer;
   forming an aluminum layer that mainly consists of aluminum on the first titanium layer on opposite side of the semiconductor layer;
   forming a titanium nitride layer comprising titanium nitride on the aluminum layer on opposite side of the first titanium layer;
   forming an electrode layer comprising copper on the titanium nitride layer on opposite side of the aluminum layer;
   forming a second titanium layer comprising titanium between the forming the aluminum layer and the forming the titanium nitride layer; and
   forming a third titanium layer comprising titanium between the forming the titanium nitride layer and the forming the electrode layer,
   wherein the forming the titanium nitride layer forms the titanium nitride layer to have a thickness of greater than 75 nm, and
   wherein the semiconductor layer comprises an n-type semiconductor of a Group III nitride.

5. The manufacturing method of the semiconductor device according to claim 4, further comprising:
   after the forming the electrode layer, performing a heat treatment for a layered structure of respective formed layers at a temperature of lower than 550° C.

6. The manufacturing method of the semiconductor device according to claim 4, wherein the forming the first titanium layer to the forming the electrode layer are all performed in a non-oxygen atmosphere.

7. The manufacturing method of the semiconductor device according to claim 4, wherein the forming the first titanium layer to the forming the electrode layer are performed continuously.

8. The manufacturing method of the semiconductor device according to claim 4, wherein the forming the first titanium layer, the forming the aluminum layer, the forming the titanium nitride layer, the forming the electrode layer, the forming the second titanium layer, and the forming the third titanium layer are continuously performed while kept in a chamber.

9. The manufacturing method of the semiconductor device according to claim 4, wherein said forming the first titanium layer comprises disposing the surface of the first titanium layer on the surface of the semiconductor layer.

* * * * *